United States Patent
Xiong et al.

(10) Patent No.: US 10,861,562 B1
(45) Date of Patent: Dec. 8, 2020

(54) DEEP LEARNING BASED REGRESSION FRAMEWORK FOR READ THRESHOLDS IN A NAND FLASH MEMORY

(71) Applicant: SK hynix Inc., Gyeonggi-do (KR)

(72) Inventors: Chenrong Xiong, San Jose, CA (US); Fan Zhang, Fremont, CA (US); Xuanxuan Lu, San Jose, CA (US); Meysam Asadi, San Jose, CA (US); Jianqing Chen, Milpitas, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/450,729

(22) Filed: Jun. 24, 2019

(51) Int. Cl.
*G11C 16/26* (2006.01)
*G11C 16/34* (2006.01)
*G11C 16/10* (2006.01)
*G06K 9/62* (2006.01)
*G06N 3/08* (2006.01)
*G06N 3/04* (2006.01)
*G06F 11/10* (2006.01)

(52) U.S. Cl.
CPC ............ *G11C 16/26* (2013.01); *G06F 11/10* (2013.01); *G06K 9/6256* (2013.01); *G06N 3/0454* (2013.01); *G06N 3/08* (2013.01); *G11C 16/10* (2013.01); *G11C 16/3404* (2013.01)

(58) Field of Classification Search
CPC ..... G11C 16/26; G11C 11/54; G11C 16/3404; G11C 16/10; G06K 9/6256; G06N 3/0454; G06N 3/08; G06F 11/10
See application file for complete search history.

(56) References Cited

U.S. PATENT DOCUMENTS

| 9,116,835 B1 | 8/2015 | Smyth |
| 2003/0093762 A1 | 5/2003 | Rietman et al. |
| 2017/0083811 A1 | 3/2017 | Cho et al. |
| 2018/0294035 A1* | 10/2018 | Vali ..................... G06N 3/0454 |
| 2019/0041948 A1 | 2/2019 | Kelly |
| 2019/0213253 A1* | 7/2019 | Ray ..................... G06F 16/353 |
| 2020/0034697 A1* | 1/2020 | Choi ................... G11C 11/5685 |
| 2020/0210831 A1 | 7/2020 | Zhang et al. |

FOREIGN PATENT DOCUMENTS

| CN | 108777157 A | 11/2018 |
| WO | 1998030421 A1 | 7/1998 |
| WO | 2018191725 A1 | 10/2018 |
| WO | 2018039648 A1 | 3/2019 |

* cited by examiner

*Primary Examiner* — David Lam
(74) *Attorney, Agent, or Firm* — Kilpatrick Townsend & Stockton LLP

(57) ABSTRACT

Techniques related to improving a performance related to at least data reads from a memory are described. In an example, a computer system hosts a regression model that includes a neural network. The neural network is trained based on training data that is measured under different combinations of operational conditions and storage conditions. In operation, actual operational and storage conditions associated with the memory are input to the regression model. The neural network outputs a voltage read threshold based on these actual conditions. The computer system uses the voltage read threshold to read data stored in the memory.

20 Claims, 9 Drawing Sheets

SLC 310

| L0 | 1 |
|---|---|
| L1 | 0 |

MLC 320

| L0 | 11 |
|---|---|
| L1 | 10 |
| L2 | 01 |
| L3 | 00 |

TLC 330

| L0 | 111 |
|---|---|
| L1 | 110 |
| L2 | 101 |
| L3 | 100 |
| L4 | 011 |
| L5 | 010 |
| L6 | 001 |
| L7 | 000 |

QLC 340

| L0 | 1111 |
|---|---|
| L1 | 1110 |
| L2 | 1101 |
| L3 | 1011 |
| L4 | 0111 |
| L5 | 1100 |
| L6 | 1001 |
| L7 | 0011 |
| L8 | 0110 |
| L9 | 0101 |
| L10 | 1010 |
| L11 | 1000 |
| L12 | 0100 |
| L13 | 0001 |
| L14 | 0100 |
| L15 | 1111 |

FIG. 3

DEEP LEARNING BASED REGRESSION FRAMEWORK FOR READ THRESHOLDS IN A NAND FLASH MEMORY

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND

In NAND flash memory, memory cells can store one or more bits as voltage values. For example, a single level cell stores one bit and the measured voltage value can be compared to a single voltage threshold to determine a logical value of the bit (e.g., a "0" or a "1"). A multi-level cell (MLC) can store two bits and the measured voltage value can be compared to three voltage thresholds to determine the logical value of each bit. Generally, the logical value stored in a memory cell is determined by the voltage window in which the cell's threshold voltage lies. As more bits per memory cell are stored, the threshold voltage window becomes smaller, resulting in increased error rates in determining the memory cell's value.

Error-correction codes (ECCs) are typically used for various types of data storage devices include NAND flash memories. ECCs are also frequently used during the process of data transmission. ECC refers to codes that add redundant data, or parity data, to a message, such that the message can be recovered by a receiver even when a number of errors were introduced, either during the process of transmission, or storage. In general, the ECC can correct the errors up to the capability of the code being used. ECC decoding can include hard decoding, such as Bose-Chaudhuri-Hocquenghem (BCH) decoding, where the logical value stored in a memory cell is determined by the voltage window in which the cell's threshold voltage lies. ECC decoding can also include soft ecoding, such as Low-density parity-check code (LDPC) decoding, where the logical value stored in a memory cell is represented as a probability distribution.

The accuracy of read threshold voltage is critical for storage devices, including solid state drives using NAND flash memory technology, because a better read threshold voltage results in a lower raw bit error rate (RBER), which determines SSD system performance such as input/output operations per second (IOPs) and throughput. However, during the life time of a storage device, the optimal read threshold voltage for a memory cell can change dependently on a large number of variable factors. Theoretically, if all the factors affecting the change to a read threshold voltage are known, the optimal read threshold can be determined from offline memory characterization. For example, a look-up table can be generated, where the table associates optimal read thresholds with possible combinations of the variable factors under different realizations of these factors. However, such a table is practically challenging to implement in part because it would need a huge number of realizations and likely does not result in optimal voltage read thresholds because not all possible combinations and realizations can be determined offline.

BRIEF SUMMARY

Techniques related to improving a performance related to at least data reads are described. The techniques involve a computer system for reading data from storage and implement methods on such a computer system. In an example, the computer system includes a processor and a memory communicatively coupled with the processor. The memory is configured to store client data, a regression model, and computer-readable instructions. The regression model includes a neural network, the neural network includes an output node, and the output node corresponds to a voltage read threshold for the memory. The computer-readable instructions upon execution by the processor configure the computer system to perform operations. The operations include inputting, to the regression model, data related to one or more input conditions associated with the memory. The operations also include receiving the voltage read threshold based on the data. The operations also include reading the client data based on the voltage read threshold.

In an example, the one or more input conditions include an operational condition and a storage condition. The operational condition includes at least one of an endurance, a retention, an age, or a temperature associated with the memory. The memory is a NAND flash memory. The storage condition includes at least one of a read distribution, a die index, a block index, or a wordline index associated with the NAND flash memory.

In an example, the neural network includes a plurality of output nodes, each corresponding to outputting one voltage read threshold.

In an example, the memory includes a memory block. The memory block includes a memory page. The neural network includes a number of output nodes based on the memory page.

In an example, the regression model includes a second neural network. The memory includes a memory block. The memory block includes a first memory page and a second memory page. The neural network is associated with the first memory page and includes a first number of output nodes based on the first memory page. The second neural is associated with the second memory page and includes a second number of output nodes based on the second memory page. The first number of output nodes is different from the second number of output nodes.

In a further example, the memory is a triple cell level (TLC) NAND flash memory. The first memory page corresponds to a most significant bit (MSB) page. The second memory page corresponds to a least significant bit (LSB) page. The first number of output nodes is three, and the second number of output nodes is two. The memory further includes a central significant bit (CSB) page. The regression model includes a third neural network. The third neural network is associated with the CSB page and includes two outputs nodes based on the CSB page.

In an example, the memory includes a plurality of memory pages. The regression model includes a plurality of neural networks each associated with one of the plurality of memory pages and having a number of output nodes based on the associated memory page.

In an example, the client data is stored in the memory as a codeword that includes bits based on an error correction code (ECC) encoding procedure. Reading the client data includes decoding the codeword based on an ECC decoding procedure that uses values for the bits based on the voltage read threshold.

In an example, the neural network is trained to output the voltage read threshold from the output node based on the data related to the one or more input conditions. The operations further include training the neural network based on training data measured under combinations of operational conditions and storage conditions. The training data includes at least one of endurance data, retention data, age data, temperature data, read distribution data, die index data, block index data, or wordline index data. The training is supervised training that uses a loss function. The loss function is computed based on voltage read thresholds each corresponding to one of the combinations of operational conditions and storage conditions.

In an example, the one or more input conditions includes a first set of discrete input conditions and a second set of continuous input conditions.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures.

FIG. 3 illustrates an example of bit storage in NAND flash memories, in accordance with certain embodiments of the present disclosure.

DETAILED DESCRIPTION

Figure 1:
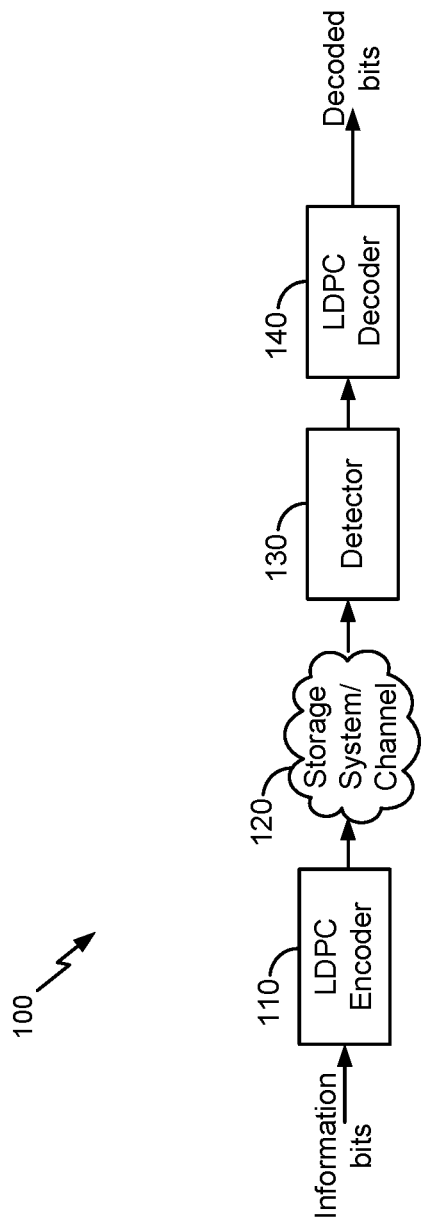
FIG. 1 illustrates an example of a high level block diagram of an error correcting system, in accordance with certain embodiments of the present disclosure.

Techniques related to improving a performance related to at least data reads from a memory are described. In an example, embodiments of the present disclosure find at least one optimal voltage read threshold for a memory. To do this, the embodiments can implement a regression model that includes a neural network. An output node of the neural network corresponds to the optimal voltage read threshold, where this voltage is an output of the output node based on one or more input conditions associated with the memory. The input conditions include operational conditions and storage conditions, are input to the regression model, and represent actual operational and storage location factors that may affect the change to a voltage read threshold. The neural network can be trained offline based on training data that is measured under different combinations of the operational conditions and storage conditions. The training can use voltage read thresholds corresponding to the combinations as ground truth. For instance, a loss function is computed based on these voltage read thresholds and on outputted voltage read thresholds each corresponding to one of the combinations of the operational conditions and storage conditions.

To illustrate, consider an example of a NAND flash memory using triple-level cell (TLC) technology, where each memory cell stores three bits of data. Eight voltage read thresholds are needed to determine the logical values of the three bits stored in a memory cell. Memory cells can be organized in a most significant bit (MSB) page, a least significant bit (LSB) page, and a central significant bit (CSB) page within a block of a die of the NAND flash memory. Three of the eight voltage read thresholds are associated with the MSB page, two of the eight voltage read thresholds are associated with the LSB page, and the remaining two of the eight voltage read thresholds are associated with the CSB page.

In this example, a first neural network is associated with the MSB page, a second neural network is associated with the LSB page, and a third neural network is associated with the CSB page. Each of these three neural networks is trained to output the needed voltage read thresholds. For instance, the first neural network includes three output nodes, each of which outputs one of the three voltage read thresholds. The first neural network is trained based on measured NAND data and cell distribution under certain combinations of operational conditions and cell locations. The training data includes known endurance data, known retention data, known read distribution data, known die index data, known block index data, known wordline index data, known age of drive data, and known operational temperature data, among other measured data for MSB pages of that type and/or design of NAND flash memory. The three optimal threshold voltages under each of the combinations are used as ground truth. Similarly, each of the second and third neural networks includes two output nodes, each corresponding to a voltage read threshold. The second and third neural networks are also trained based on training data for the respective page.

Once trained and in operation, input conditions including actual operations conditions and cell locations, such as actual endurance data, actual retention data, actual read distribution data, actual die index data, actual block index data, actual wordline index data, actual age of drive data, and actual operational temperature data for each of the pages are input to the corresponding neural network. Hence, three voltage read thresholds are output from the first neural network for the MSB page, two voltage read thresholds are output from the second neural network for the LSB page, and two voltage read thresholds are output from the third neural network for the CSB page. The three voltage read thresholds are used to determine the logical values of the bits stored in the MSB page, the first two voltage read thresholds are used to determine the logical values of the bits stored in the LSB page, and the two other voltage read threshold are used to determine the logical values of the bits stored in the CSB page. The logical values can be input to an ECC decoder employing a hard ECC decoding procedure or a soft decoding procedure to then decode and output the data stored in the three pages.

The embodiments of the present disclosure provide several advantages related to computer storage. For example, the embodiments provide better voltage read thresholds relative to existing systems (e.g., for existing systems that do not change these thresholds or change them using a predefined table). The better read thresholds result in a lower RBER that, in turn, improves the performance of the data storage device, including IOPs and throughput.

In the interest of clarity of explanation, the embodiments of the present disclosure are described in connection with LDPC codewords and NAND flash memories. However, the embodiments are not limited as such and apply to any other encoding decoding procedures and any other type of data storage.

FIG. 1 illustrates an example of a high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic, solid state) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit (e.g., a logical value of "1" or "0"). On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes. The connections between variable nodes and check nodes are described by and correspond to the values of the parity-check matrix.

In an example, a hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

In another example, a soft message passing algorithm may be performed. In this example, $L(q_{ij})$ represents a message that is sent by variable node $v_i$ to check node $c_j$; $L(r_{ji})$ represents the message sent by check node $c_j$ to variable node $v_i$; and $L(c_i)$ represents initial LLR value for each variable node $v_i$. Variable node processing for each $L(q_{ij})$ can be done through the following steps:

(1) Read $L(c_i)$ and $L(r_{ji})$ from memory.
(2) Calculate $L(Q_i\text{-sum})=L(c_i)+\text{Scaling Factor}*\Sigma_{j'\in c_i}L(r_{ji})$.
(3) Calculate each $L(Q_i\text{-sum})-L(r_{ij})$.
(4) Output $L(Q_i\text{-sum})$ and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each $L(r_{ji})$ can be performed as follows:
(1) Read one row of $q_{ij}$ from memory.
(2) Calculate $L(Rj\text{-sum})$ as follows:

$$L(Rj-\text{sum}) = \left(\prod_{i'\in Rj} \alpha_{i'j}\right)\emptyset\left(\sum_{i'\in Rj} \emptyset(\beta_{i'j})\right)$$

$$\alpha_{ij} = \text{sign}(L(q_{ij})), \beta_{ij} = |L(q_{ij})|,$$

$$\emptyset(x) = -\log\left(\tanh\left(\frac{x}{2}\right)\right) = \log\left(\frac{e^x+1}{e^x-1}\right)$$

(3) Calculate the individual $L=(r_{ji})=(\Pi_{i'\in R_{ji}}\alpha_{ij})\emptyset(\Sigma_{i'\in R_{ji}}\emptyset(\beta_{ij}))$ for check nodes.
(4) Write back $L(r_{ji})$ to memory.
(5) If this is not the last row of memory, then go to the first step and increment j by one.

Figure 2:
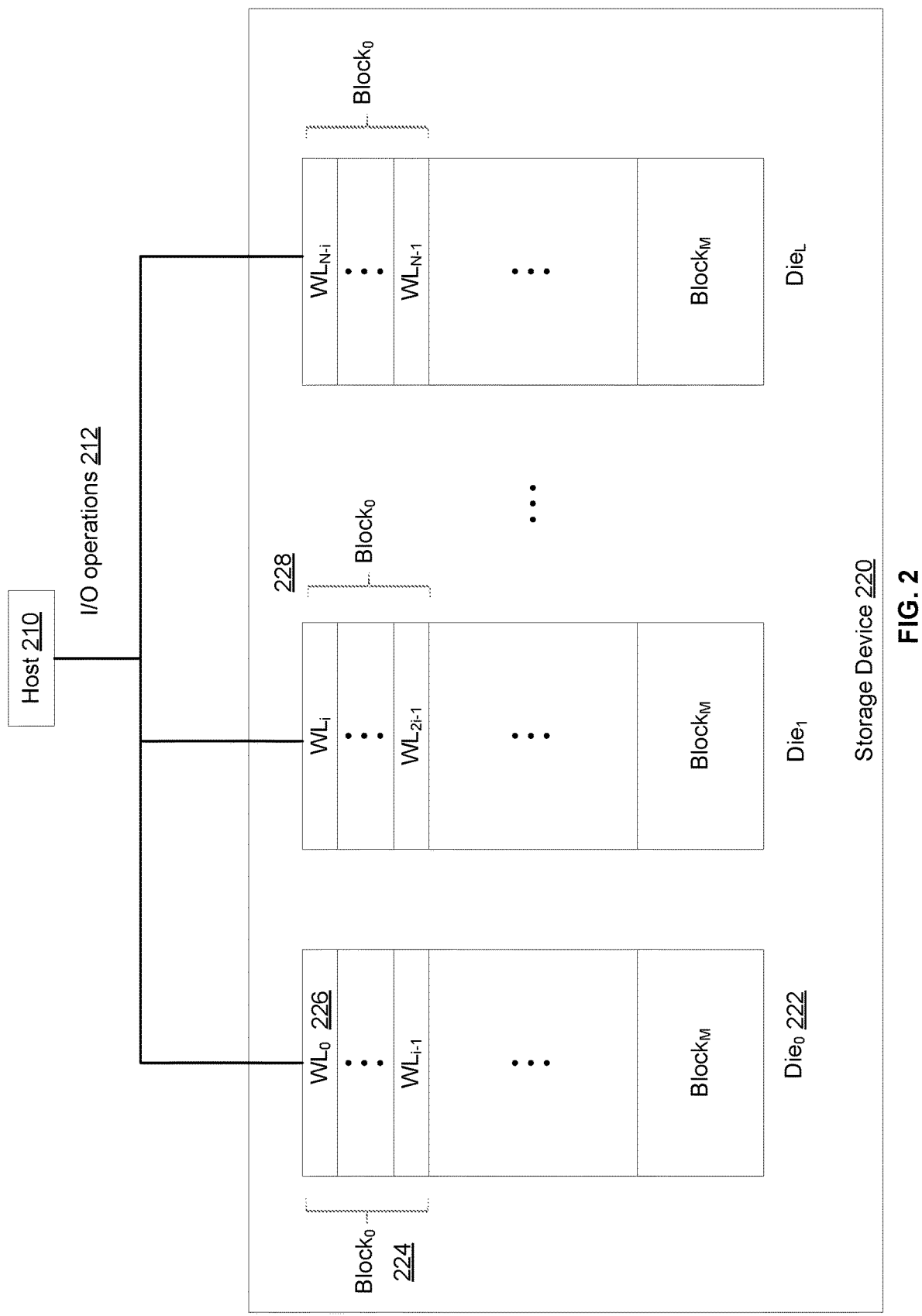
FIG. 2 illustrates an example of a computer system that includes a host and a storage device, in accordance with certain embodiments of the present disclosure.

FIG. 2 illustrates an example of a computer system that includes a host 210 and a storage device 220, in accordance with certain embodiments of the present disclosure. The host 210 performs I/O operations 212 including writing data to the storage device 220 and reading data from the storage device 220. In an example, writing the data includes encoding the data with one or more LDPC encoders (not shown in FIG. 2) to generate LDPC codewords that are stored in the storage device 220. Reading the data includes decoding the LDPC codewords with one or more LDPC decoders (not shown in FIG. 2) to output decoded data from the storage device 220. The encoding and decoding (e.g., the LDPC encoder(s) and decoder(s)) are part of an ECC system that can be implemented between the host 210 and the storage device 220.

In an example, the storage device 220 includes a number of memory dies 222 (this number is shown as "L" in FIG. 2). In turn, each memory die 222 contains memory cells that can be organized in a number of blocks 224 (this number is shown as "M" in FIG. 2). Each of the blocks 224 contains a number of wordlines 226 (this number is shown as "i" in FIG. 2). The memory cells may be floating-gate transistors such as floating-gate MOSFETs. The memory cells may be grouped and/or referenced using a wide range of configurations, including columns, bitlines, pages, and wordlines. Other groupings of memory cells 102 are also possible, including groupings across different chips, dies, planes, among others. In some embodiments, a page of a block can represent a minimum programmable unit and a minimum readable unit.

For NAND flash, each block 224 contains sixty-four pages for a single-level cell (SLC) flash, one-hundred twenty-eight pages for a multi-level cell (MLC) flash, three-hundred eighty-four pages triple-level cell (TLC) flash. The size of a page can range from 2 KB to 8 KB. In MLC flash, the two bits within a single cell are not mapped to the same page. Rather, the collection of most significant bits (MSBs) from a group of cells form a page called the MSB page. The least significant bits (LSBs) from the same group of cells form a page called the LSB page. Similarly, for TLC, MSB and LSB pages exist. In addition, bits that are from the same group and that are between the MSBs and LSBs form a page called the central significant bit (CSB) page.

In some instances, one or more components of the storage device 220 may become unusable due to failure prior to or during operation of storage device 220. Causes of a failure may be due to defects during the manufacturing process, mechanical stress to the storage device 220 prior to or during use, degradation of the dielectric material in memory cells, among others. Failures may occur at the memory cell level, which may propagate and cause failures within other components of the storage device 220. A group of memory cells can be considered to fail when no data from any one of the memory cells in the group is writable and/or readable. Additionally or alternatively, a group may be considered to fail when at least one of the memory cells in the group is neither writable and/or readable. In such instances, an EEC scheme (e.g., a combination of an ECC encoding procedure and an ECC decoding procedure) is usable to protect and/or recover the data in the failed group.

FIG. 3 illustrates an example of bit storage in NAND flash memories, in accordance with certain embodiments of the present disclosure. Four such memories are illustrated: a single-level cell (SLC) NAND flash memory 310, a multiple-level cell (MLC) NAND flash memory 320, a triple-level cell (TLC) NAND flash memory 330, and a quad-level cell (QLC) NAND flash memory 340. Generally, one or more bits are stored in a cell depending on the type of the NAND flash memory. The storage relies on a mapping that associates a logical value of a bit (e.g., whether a "0" or a "1") with a voltage level. A voltage level corresponds to a range of voltage such that, if a voltage read falls in the range, this voltage can be declared as belonging to the voltage level.

Specific to the SLC NAND flash memory 310, one bit (e.g., an information bit or a parity bit) can be stored in a cell. Hence, there are two possible voltage levels for the cell. The mapping defines a voltage read threshold between these two levels. To check whether the cell contains a "0" or a "1," voltage is read and compared to the voltage read threshold to identify the relevant voltage level and, accordingly, the logical value of the bit. For instance, if the read voltage value is smaller than the voltage read threshold, the first voltage level is identified and the logical value of the bit is determined to be a "0." Otherwise, the second voltage level is identified and the logical value of the bit is determined to be a "1."

In comparison, for the MLC NAND flash memory 320, two bits can be stored in a cell. Hence, there are four possible voltage levels for the cell. The mapping defines three voltage read thresholds between these four levels. To check whether each bit contained in the cell is a "0" or a "1," voltage is read and compared to the three voltage read thresholds to identify the relevant voltage level and, accordingly, the logical values of the bits.

Similarly, for the TLC NAND flash memory 330 and QLC NAND flash memory 340, three bits and four bits, respectively, can be stored in a cell. Hence, there are eight and sixteen possible voltage levels for the cell for the TLC NAND flash memory 330 and QLC NAND flash memory 340, respectively. The mapping of TLC NAND flash memory 330 defines seven voltage read thresholds between the eight voltage levels. The mapping of QLC NAND flash memory 340 defines fifteen voltage read thresholds between the sixteen voltage levels. To check whether each bit contained in the cell is a "0" or a "1," voltage is read and compared to the voltage read thresholds to identify the relevant voltage level and, accordingly, the logical values of the bits.

Figure 4:
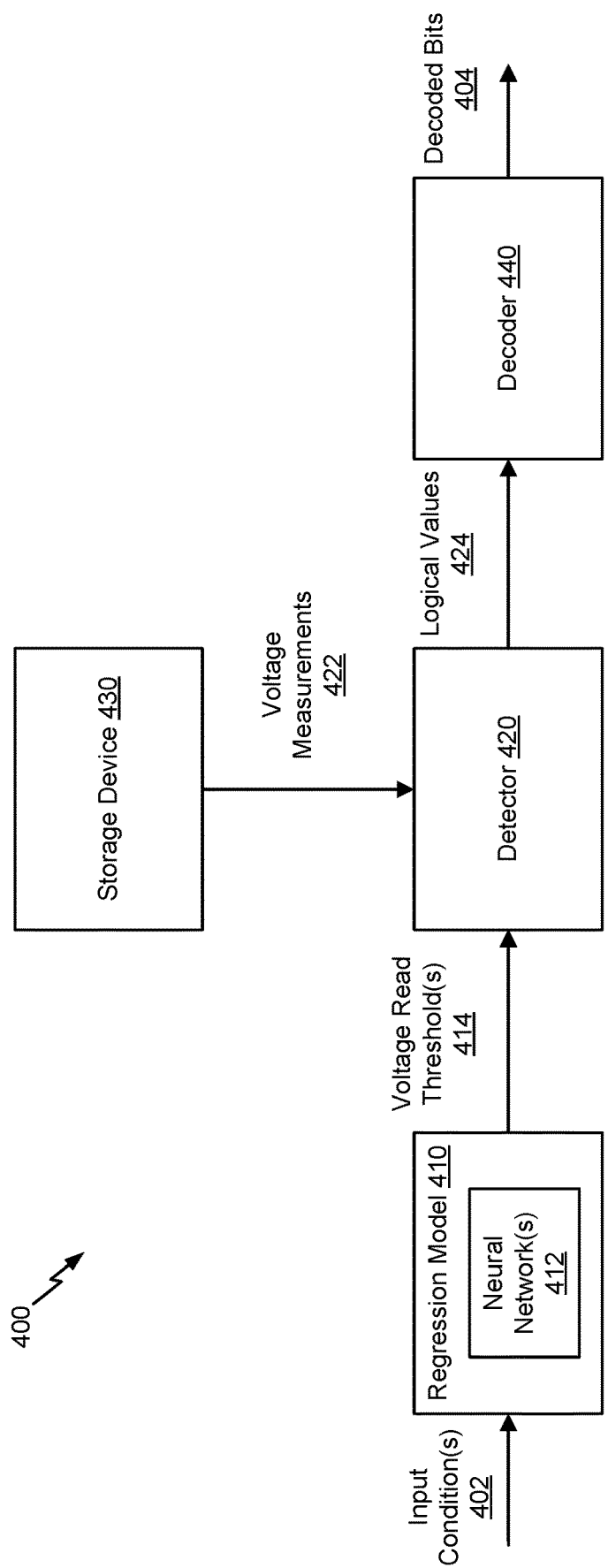
FIG. 4 illustrates an example of a computer system that includes a regression model for determining voltage read thresholds, in accordance with certain embodiments of the present disclosure.

FIG. 4 illustrates an example of a computer system 400 that includes a regression model 410 for determining voltage read thresholds, in accordance with certain embodiments of the present disclosure. As illustrated, the computer system 400 also includes a detector 420, a data storage 430, and a decoder 440. The detector 420, the storage device 430, and the decoder 440 are examples of the detector 130, the storage system 120, and the LDPC decoder 140 of FIG. 1, respectively.

Although FIG. 4 shows these components as being separate, some or all of the components can be combined. For example, the storage device 430 can be an SSD storage device using NAND flash memory, wherein this storage device 430 includes the regression model 410, the detector 420, and the decoder 440 among other components (e.g., a processor that executed computer-readable storage medium stored in the NAND flash memory or another memory of the storage device 430. Alternatively, some or all of the components need not be part of the computer system 400. For instance, a second computer system can store the regression model 410. A data interface may exist between the computer system 400 and the second computer system, where the computer system 400 sends the relevant data to the second computer system over the data interface, and where the second computer system responds with the voltage read thresholds to the computer system over the data interface.

The computer system 400 can include a controller that inputs one or more input conditions 402 associated with the storage device 430 to the regression model 410. In response, the regression model 410 outputs one or more voltage read thresholds 414. In an example, the regression model 410 includes one or more neural network(s) 412 trained to generate and output the one or more voltage read threshold(s) based on the one or more input conditions 402.

The detector 420 may receive the one or more voltage read thresholds 414 and may perform voltage measurements 422 to determine logical values 424 of bits stored by the storage device 430. Determining the logical values includes comparing the voltage measurements 422 to the one or more voltage read thresholds 414. The detector 420 outputs the logical values 424 to the decoder 440.

The decoder 440 may implement an ECC decoding procedure to decode the logical values 424 into decoded bits 404. The ECC decoding procedure may depend on the ECC encoding procedure used to encode client data as bits stored on the storage device 430. For instance, if a particular type of LDPC encoding procedure was used to store the client data as LDPC codewords, the decoder 440 uses a corresponding LDPC decoding procedure.

In an example, the one or more input conditions 402 include operational conditions and storage conditions associated with the storage device 430. The operational conditions indicate factors related to operating the storage device 430. These factors include, for instance, an endurance, a retention, an age, and/or a temperature of operation. The storage conditions indicate factors related to how the client data is stored on the storage device 430. These factors include, for instance, a read distribution, a die index, a block index, or a wordline index. As input to the regression model 410, a combination all of the factors can be provided representing a certain combination of actual operational conditions and actual storage conditions. In addition, some of these factors can have discrete values and such discrete values as provided as the input. Other factors can have continuous values and the computer system 400 may continuously measure these values and, upon a data read command, may generate discrete values from the most recent measurements as the input to the regression model 410.

As explained herein above, the regression model 410 includes one or more neural network(s) 412. Generally, the number of the neural networks depends on the type of the storage device 430 and/or the needed number of voltage read thresholds. Generally, each neural network includes a number of output nodes, each of which generates a read voltage threshold. In an example, the storage device 410 includes a NAND flash memory. The memory cells of the NAND flash memory can be organized in multiple memory pages. In turn, each memory page may necessitate a particular number of voltage read thresholds and these numbers can be different between the memory pages. In this example, one neural network can be set-up per memory page and the number of output nodes for this neural network may depend on the associated memory page (e.g., on its associated particular number of voltage read thresholds). For instance, if there are two memory pages, a first one necessitating one voltage read threshold and a second one necessitating two voltage read thresholds, two neural networks can be used. The first neural network is associated with the first memory page and has a single output node. In comparison, the second neural network is associated with the second memory page and has two output nodes.

When multiple neural networks are used, each of these networks is associated with a memory page (e.g., a table is stored, where this table identifies each memory page and the associated neural network). Upon a data read command, the page number of a memory page may be used to identify the neural network to use for obtaining the voltage read threshold for that memory page.

Each of the neural networks can also be trained based on training data that is measured under combinations of operational conditions and storage conditions. The training data for a particular neural network associated with a memory page (or, more generally, some other portion of a memory) can be specific to the memory page (or the other portion). In other words, the training data is measured data for that specific type and/or design of the memory page (or the other portion). Generally, the training data includes endurance data, retention data, age data, temperature data, read distribution data, die index data, block index data, and/or word-line index data. In addition, for each of the combinations, the optimal voltage read threshold(s) can be measured. The optimal voltage read thresholds are used as ground truth during the training to minimize the loss function of the neural network.

To illustrate, consider an example of a TLC NAND flash memory. This memory includes an MSB page that needs three voltage read thresholds, a CSB page that needs two voltage read thresholds, and an LSB page that needs two voltage read thresholds. Accordingly, three neural networks can be set-up. The first neural network is associated with the MSB page and has three output nodes, one per each of the three voltage read thresholds. The first neural network is trained based on measured data specific to MSB pages for TLC NAND flash memories. The second neural network is associated with the CSB page and has two output nodes, one per each of the two voltage read thresholds. The second neural network is trained based on measured data specific to CSB pages for TLC NAND flash memories. The third neural network is associated with the LSB page and has two output nodes, one per each of the two voltage read thresholds. The third neural network is trained based on measured data specific to LSB pages for TLC NAND flash memories.

Figure 5:
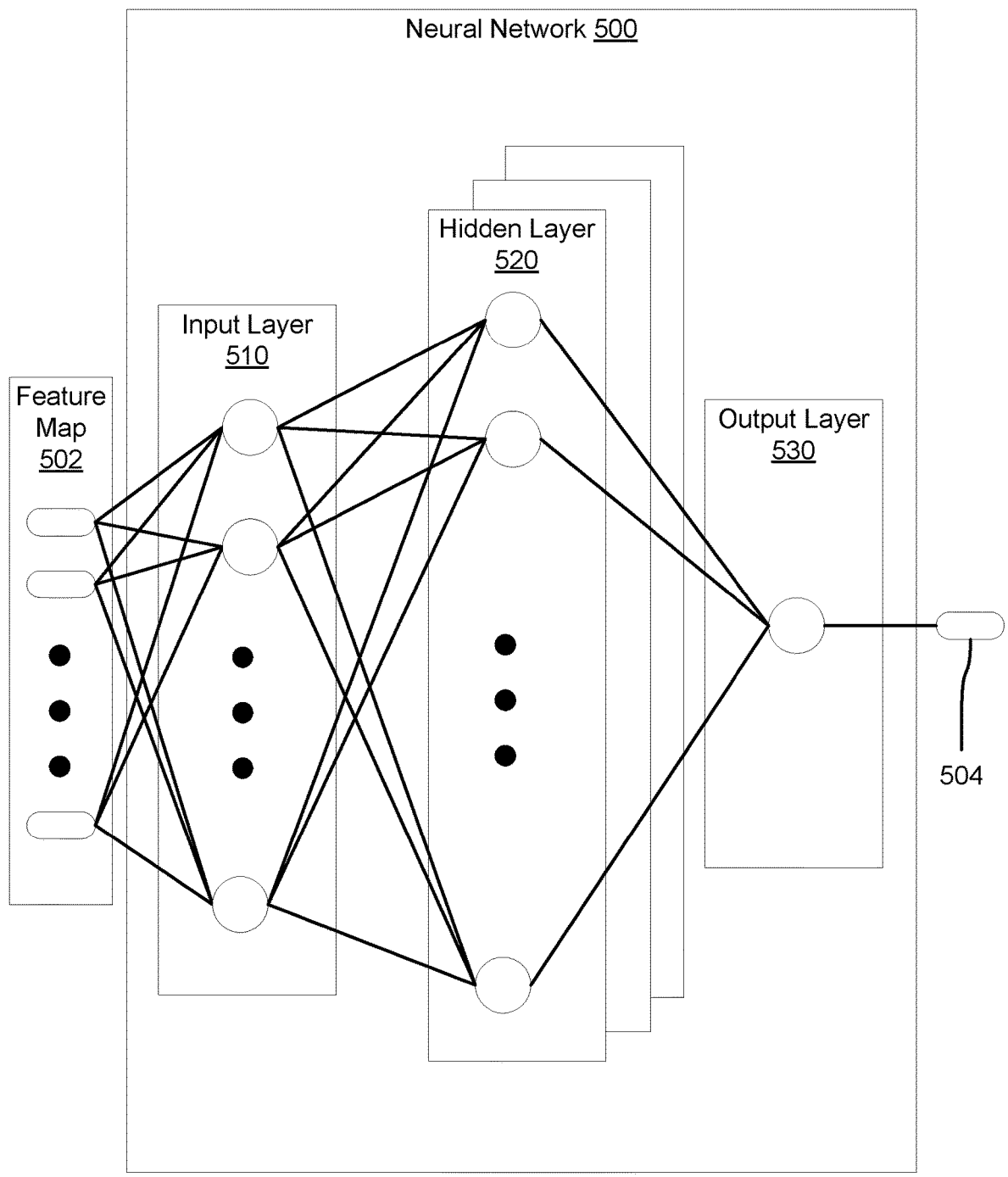
FIG. 5 illustrates an example of a neural network that can be included in a regression model for determining voltage read thresholds, in accordance with certain embodiments of the present disclosure.

FIG. 5 illustrates an example of a neural network 500 that can be included in a regression model for determining voltage read thresholds, in accordance with certain embodiments of the present disclosure. The neural network 500 is an example of any of the one or more neural network 412 of FIG. 5. A feature map 502 associated with one or more input conditions (e.g., the one or more input conditions 402 of FIG. 4, where each feature represents a factor) is input to the neural network 500. In turn, the neural network 500 outputs a voltage read threshold 504 (for clarity a single voltage read threshold 504 is illustrated, however multiple voltage read thresholds 504 can be output as explained herein above). As illustrated, the neural network 500 includes multiple layers.

Features from the feature map 502 are connected to input nodes in an input layer 510 of the neural network. The voltage read threshold 504 is generated from an output node of an output layer 530. One or more hidden layers 520 of the neural network 500 exist between the input layer 510 and the output layer 530. The neural network 500 is pre-trained to process the features from the feature map 502 through the different layers 510, 520, and 530 in order to output the voltage read threshold 504.

In some embodiments, the neural network 500 is a multi-layer neural network that represents a network of interconnected nodes, such as an artificial deep neural network, where knowledge about the nodes (e.g., information about specific features represented by the nodes) is shared across layers and knowledge specific to each layer is also retained. Each node represents a piece of information. Knowledge can be exchanged between nodes through node-to-node interconnections. Input to the neural network 500 activates a set of nodes. In turn, this set of nodes activates other nodes, thereby propagating knowledge about the input. This activation process is repeated across other nodes until nodes in an output layer are selected and activated.

As illustrated, the neural network 500 includes a hierarchy of layers representing a hierarchy of nodes interconnected in a feed-forward way. The input layer 510 exists at the lowest hierarchy level, an input layer 510 exists. The input layer 510 includes a set of nodes that are referred to herein as input nodes. When the feature map 502 is input to the neural network 500, each of the input nodes of the input layer 510 is connected to each feature of the feature map. Each of the connections has a weight. These weights are one set of parameters that are derived from the training of the neural network 500. The input nodes transform the features by applying an activation function to these features. The information derived from the transformation are passed to the nodes at a higher level of the hierarchy.

The output layer 530 exists at the highest hierarchy level. The output layer 530 includes one or more output nodes. Each output node provides specific value for a voltage read threshold. The number of output nodes depends on the needed number of voltage read thresholds. For instance, if two voltage read thresholds are needed to determine the logical values in a memory page associated with the neural network 500, two output nodes are used, each generating and outputting one of the two voltage read thresholds. In other words, there is a one-to-one relationship or mapping between the number of output nodes and the number of voltage read thresholds.

The hidden layer(s) 520 exists between the input layer 510 and the output layer 530. The hidden layer(s) 520 includes "N" number of hidden layers, where "N" is an integer greater than or equal to one. In turn, each of the hidden layers also includes a set of nodes that are referred to herein as hidden nodes. Example hidden layers include up-sampling, convolutional, fully connected layers, and data transformation layers.

At the lowest level of the hidden layer(s) 520, hidden nodes of that layer are interconnected to the input nodes. At the highest level of the hidden layer(s) 520, hidden nodes of that level are interconnected to the output node. The input nodes are not directly interconnected to the output node(s). If multiple hidden layers exist, the input nodes are interconnected to hidden nodes of the lowest hidden layer. In turn, these hidden nodes are interconnected to the hidden nodes of the next hidden layer and so on and so forth.

An interconnection represents a piece of information learned about the two interconnected nodes. The interconnection has a numeric weight that can be tuned (e.g., based on a training dataset), rendering the neural network 500 adaptive to inputs and capable of learning.

Generally, the hidden layer(s) 520 allows knowledge about the input nodes of the input layer 510 to be shared among the output nodes of the output layer 530. To do so, a transformation $f$ is applied to the input nodes through the hidden layer 520. In an example, the transformation $f$ is non-linear. Different non-linear transformations $f$ are available including, for instance, a rectifier function $f(x)=\max(0, x)$. In an example, a particular non-linear transformations $f$ is selected based on cross-validation. For example, given known example pairs (x,y), where $x \in X$ and $y \in Y$, a function $f: X \rightarrow Y$ is selected when such a function results in the best matches.

The neural network 500 also uses a loss function l (or, referred to also as a cost function c) to find an optimal solution. The optimal solution represents the situation where no solution has a loss less than the loss of the optimal solution. In an example, the loss function l includes a mean-squared error function that minimizes the average squared error between an output $f(x)$ and a target value y over all the example pairs (x, y). A backpropagation algorithm that uses gradient descent to minimize the loss function is used to train the neural network 500. In an example, the training is a supervised training. During the supervised training, the target value y can be set as the optimal voltage read threshold for a particular combination of operational conditions and storage conditions. Information about this threshold and these conditions can be available as training labels. The output $f(x)$ can be the learned voltage read threshold based on the particular combination as the input. The goal of the training is to refine the parameters of the neural network to minimize the difference between the target value y and the output $f(x)$.

As such, the hidden layer(s) 520 retains knowledge about the input nodes. A set of knowledge is shared across the output node(s) based on the interconnections of the hidden nodes and the input nodes.

In an illustration, the neural network 500 is a deep learning neural network used for NAND flash memory. To train this network, labeled data is collected by measuring NAND data and cell distribution under certain combinations of operation conditions and memory cell locations. The corresponding optimal read threshold voltages are also collected. For conditions with continues values, discrete values are generated and used.

The deep leaning neural network is created with "K" input nodes and an output node, where "K" is the number of factors (e.g., features) that define the input conditions. The output node(s) is (are) used to perform an activation function to calculate the optimal read threshold voltage(s) for a certain combination of input conditions. The number of layers and size of each layer depends on the NAND flash memory and the data amount that this memory can store. The number of layers and size can be selected as hyperparameters of the training model.

Once trained, a specific combination of operational conditions and storage conditions (e.g., the current conditions) is provided to the deep learning neural network. In turn, the deep learning neural network computes the optimal read threshold voltage for the specific condition. The optimal read threshold voltage is an output of the deep learning neural network and can be applied to the NAND flash memory for read operations.

Figure 6:
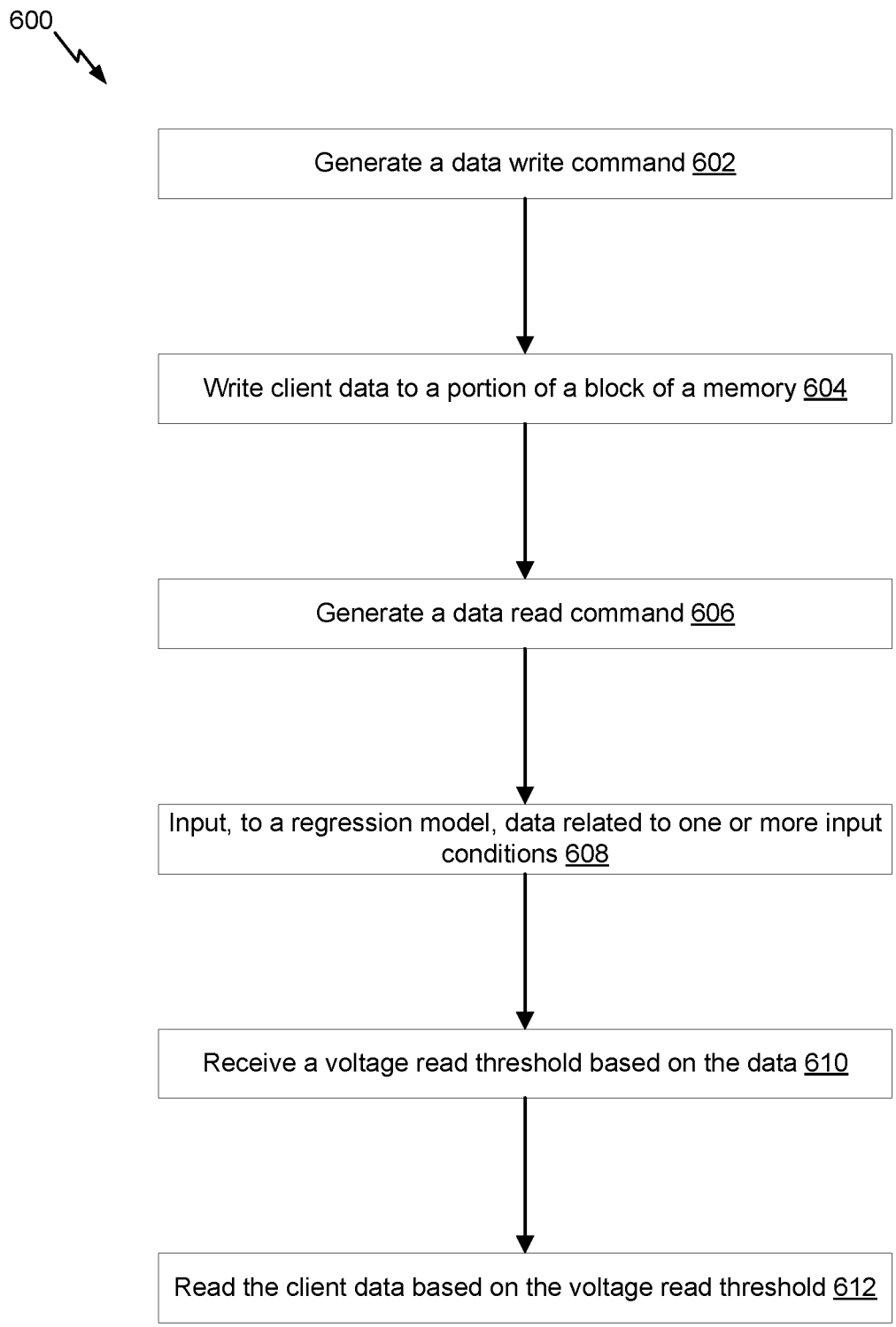
FIG. 6 illustrates an example of a flow for decoding codewords from a block of a memory, in accordance with certain embodiments of the present disclosure.
Figure 7:
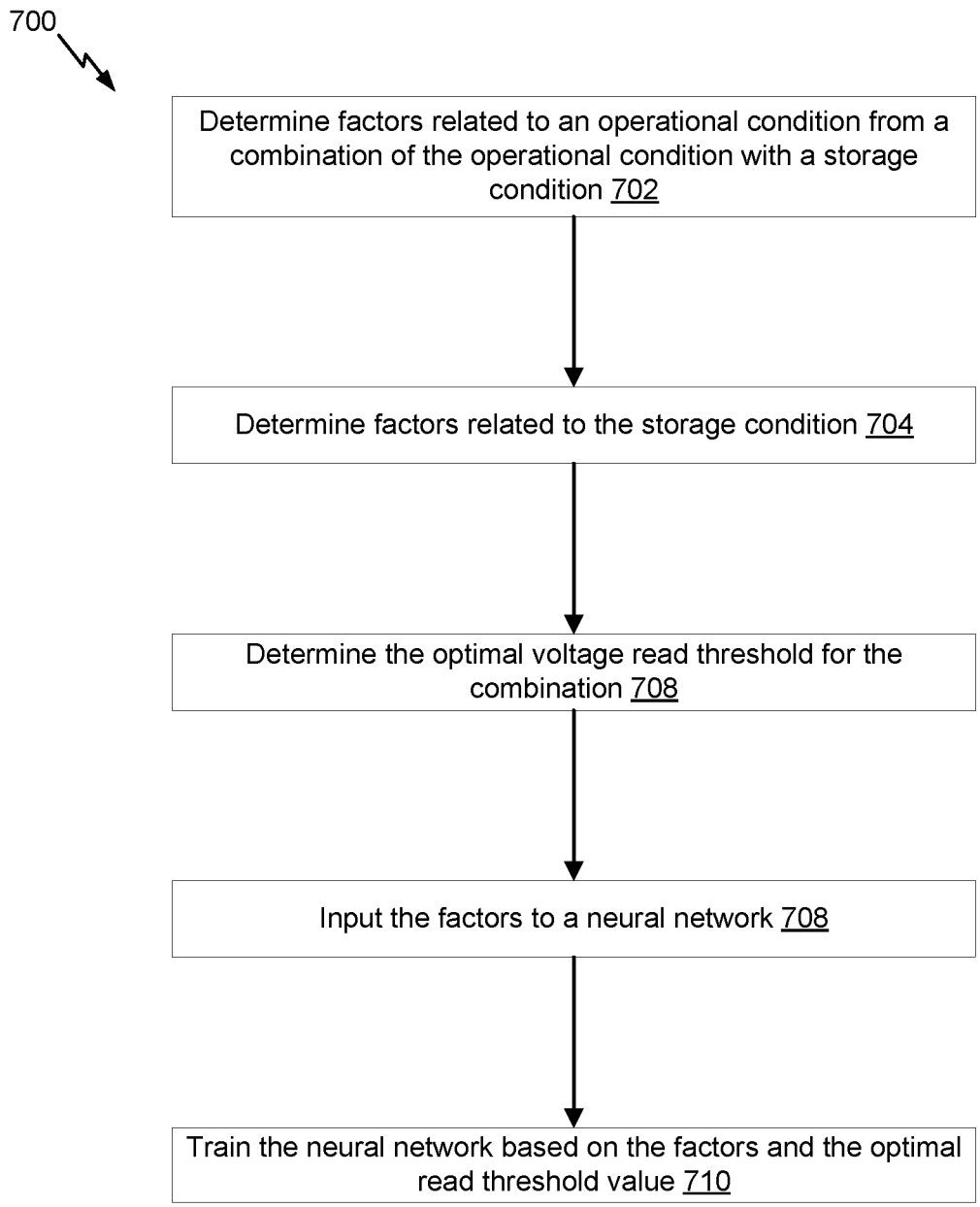
FIG. 7 illustrates an example of a flow for training a neural network, in accordance with certain embodiments of the present disclosure.
Figure 8:
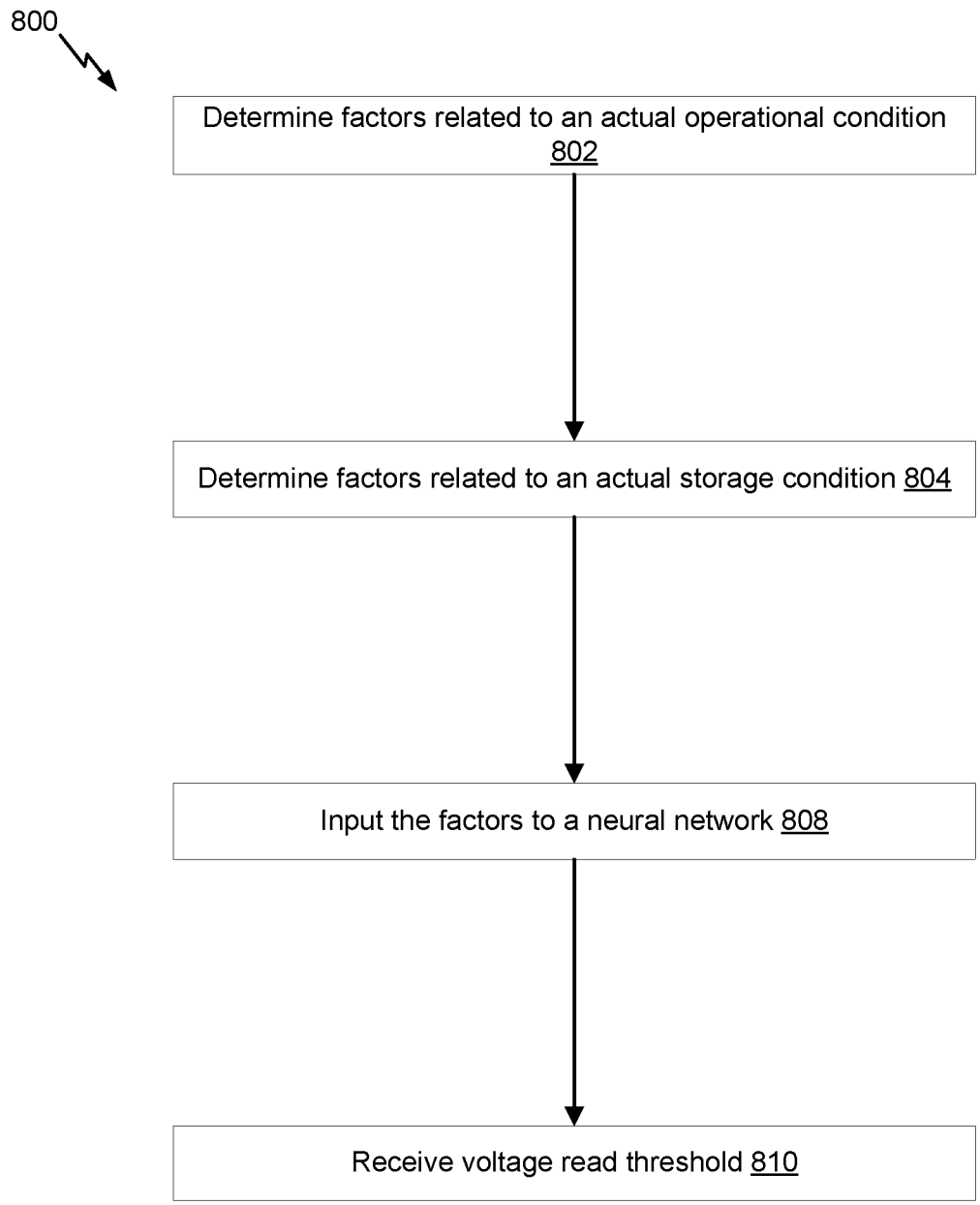
FIG. 8 illustrates an example of a flow for receiving a voltage read threshold from a neural network, in accordance with certain embodiments of the present disclosure.

FIGS. 6-8 illustrate example flows for improving a performance related to at least data reads. A computer system is described as performing particular operations of the example flows 600 and 800. The computer system is an example of the error correction system 100 of FIG. 1, the host 210 and the storage device 220 of FIG. 2, and the computer system 400 of FIG. 4. An offline computer system is described as performing particular operations of the example flow 700. The computer system and the offline computer system may, but need not, be the same. In addition, each of such computer systems has a specific hardware configuration to perform the operations. Alternatively or additionally, each of such computers' system may include generic hardware configured with specific instructions by including, for instance, one or more processors and one or more memories. The memory(ies) stores computer-readable instructions to embody functionalities specific to each of such computer systems. The instructions, when executed by the processor(s), result in performance of the functionalities. The instructions stored in the memory(ies) in conjunction with the underlying processor(s) represent means for performing the functionalities. Some of the operations across the example flows are similar. In the interest of brevity, the similarities are not repeated herein. Further, although the operations are illustrated in a particular order, other arrangement of the operations are possible and some of the operations may be skipped as it would be apparent to a person skilled in the art.

FIG. 6 illustrates an example of a flow 600 for decoding codewords from a block of a memory, in accordance with certain embodiments of the present disclosure. The flow 600 may start at operation 602, where the computer system generates a data write command. For example, the computer system includes a controller and a memory, such as a NAND flash memory (or some other type of storage device). The controller may store client data in the memory for a client. Doing so includes receiving a request from the client to store the data. Based on the request, the controller generates and sends the data write command to the memory. This command can identify a portion of the memory (e.g., a memory page within a block of the NAND flash memory) to store the data and can include the client data (e.g., information bits).

At operation 604, the computer system writes the client data to the portion of the block of the memory. In an example, writing the client data can include protecting the information bits with an ECC encoding procedures, such as one that uses parity bits, to store the client data as codewords. The codewords can be written to the portion of the block based on a set of write parameters including programming write speed, voltage ranges, and/or voltage thresholds among other parameters.

At operation 606, the computer system generates a data read command. For example, based on a request for the client data from the client, the controller generates and sends the data read command to the memory. This command may identify the portion of the block from which the client data should be read.

At operation 608, the computer system inputs to a regression model, data related to one or more input conditions associated with the memory. In an example, the regression model includes a neural network. In turn, the neural network includes an output node that corresponds to a voltage read threshold for the memory. For instance, the output node can generate the voltage read threshold based on the one or more input conditions being input as features to the neural network, once the neural network is trained. The one or more input conditions include a combination of one or more operational conditions and/or one or more storage conditions. Example operational conditions include an endurance, a retention, an age, or a temperature associated with the memory. Example storage conditions include, for a NAND flash memory, a read distribution, a die index, a block index, or a wordline index associated with the NAND flash memory.

At operation 610, the computer system receives the voltage read threshold based on the data. For example, the voltage read threshold is generated by the neural network and is an output of the output node.

At operation 612, the computer system reads the client data based on the voltage read threshold. In an example, the client data is stored in the memory as a codeword that includes bits based on an ECC encoding procedure. In this example, reading the client data includes decoding the codeword based on an ECC decoding procedure that uses values for the bits based on the voltage read threshold. In particular, the computer system can perform voltage measurements and compare the voltage measurements to the voltage read threshold. Based on the comparison, the computer system determines the logical values of the bits. The logical values, and soft information as applicable, are input to the ECC decoding procedure to decode and output information bits corresponding to the client data.

In the interest of clarity of explanation, the flow 600 is described in connection with a single output node and a corresponding voltage read threshold. However, and as described herein above, the neural network can include multiple output nodes depending on the memory type and/or amount of client data, where each output node corresponds to a voltage read threshold. The flow 600 similarly applies to such a situation.

FIG. 7 illustrates an example of a flow 700 for training a neural network, in accordance with certain embodiments of the present disclosure. The flow 700 can be performed offline to train the neural network by an offline computer system. Once trained, the neural network (or instances thereof) can be deployed to or installed in the computer system.

The flow 700 may start at operation 702, where the offline computer system determines factors related to an operational condition from a combination of the operational condition with a storage condition associated with a memory of a particular type or design (e.g., a NAND flash memory). In an example, the memory may be subject to testing in a controlled environment, where different operational conditions and storage conditions can be tested. Additionally or alternatively, computer simulation can be used to simulate the operational conditions and storage conditions. In both cases, each condition can represent one or more factors that may impact how the memory operates or how the data is stored. In also both cases, measurements (whether test measurements or simulation measurements) are available for combinations of one or more operational conditions and/or one or more storage conditions and represent training data (e.g., measured data and/or simulated data) of the factors. The training data includes, for instance, endurance data, retention data, age data, temperature data, read distribution data, die index data, block index data, wordline index data. Further, for each of the combinations, an optimal voltage read threshold can be determined (e.g., measured or simulated) and can be used as ground truth in the training. Accordingly, under operation 702, the computer system selects one of the operational conditions from one of the combinations and determines the training data specific to the related operational factors.

At operation 704, the offline computer system determines factors related to the storage condition. For example, the computer system selected one of the storage conditions from the combination and determines the related the training data specific to the related storage factors.

At operation 706, the offline computer system determines the optimal voltage read threshold for the combination. In an example, the voltage read threshold is determined from the training data (e.g. the ground truth) specific to the combination.

At operation 708, the offline computer system inputs the factors to the neural network. In an example, the training data specific to the determined operational and storage factors are input as a feature map to the neural network.

At operation 710, the offline computer system trains the neural network based on the factors and the optimal read threshold value. In an example, a loss function is defined based on the optimal voltage read threshold and an output voltage read threshold from the neural network. The training can be iterative to minimize the loss function, where parameters of the neural network are updated in each training iteration.

In the interest of clarity of explanation, the flow 700 is described in connection with a single voltage read threshold and a single combination of one or more operational conditions and/one or more storage conditions. However, and as described herein above, the flow 700 similarly applies to the neural network to output multiple voltage read threshold and the training involves training data for multiple combinations of one or more operational conditions and/one or more storage conditions.

FIG. 8 illustrates an example of a flow 800 for receiving a voltage read threshold from a neural network, in accordance with certain embodiments of the present disclosure. The neural network may be trained based on the example flow 700 of FIG. 7.

The flow 800 may start at operation 802, where the computer system determines factors related to an actual operational condition associated with the memory. In an example, the factors include an endurance, a retention, an age, or a temperature related to operating the memory. Some of these factors may be computed by the computer system, while other factors may be received from other systems. For instance, the age may be computed as a comparison between a manufacturing date of the computer system and current data for operating the memory. In comparison, the temperature may be received from a temperature sensor.

At operation 804, the computer system determines factors related to an actual storage condition associated with the memory. In an example of a NAND flash memory, the factors include a read distribution, a die index, a block index, or a wordline index associated with the NAND flash memory.

At operation 806, the computer system inputs the factors to the neural network. In an example, the computer system generates a feature map from the actual values of the factors. The feature map is input to the neural network.

At operation 808, the computer system receives a voltage read threshold from the neural network. In an example, the voltage read threshold is an output of the neural network based on the feature map.

Figure 9:
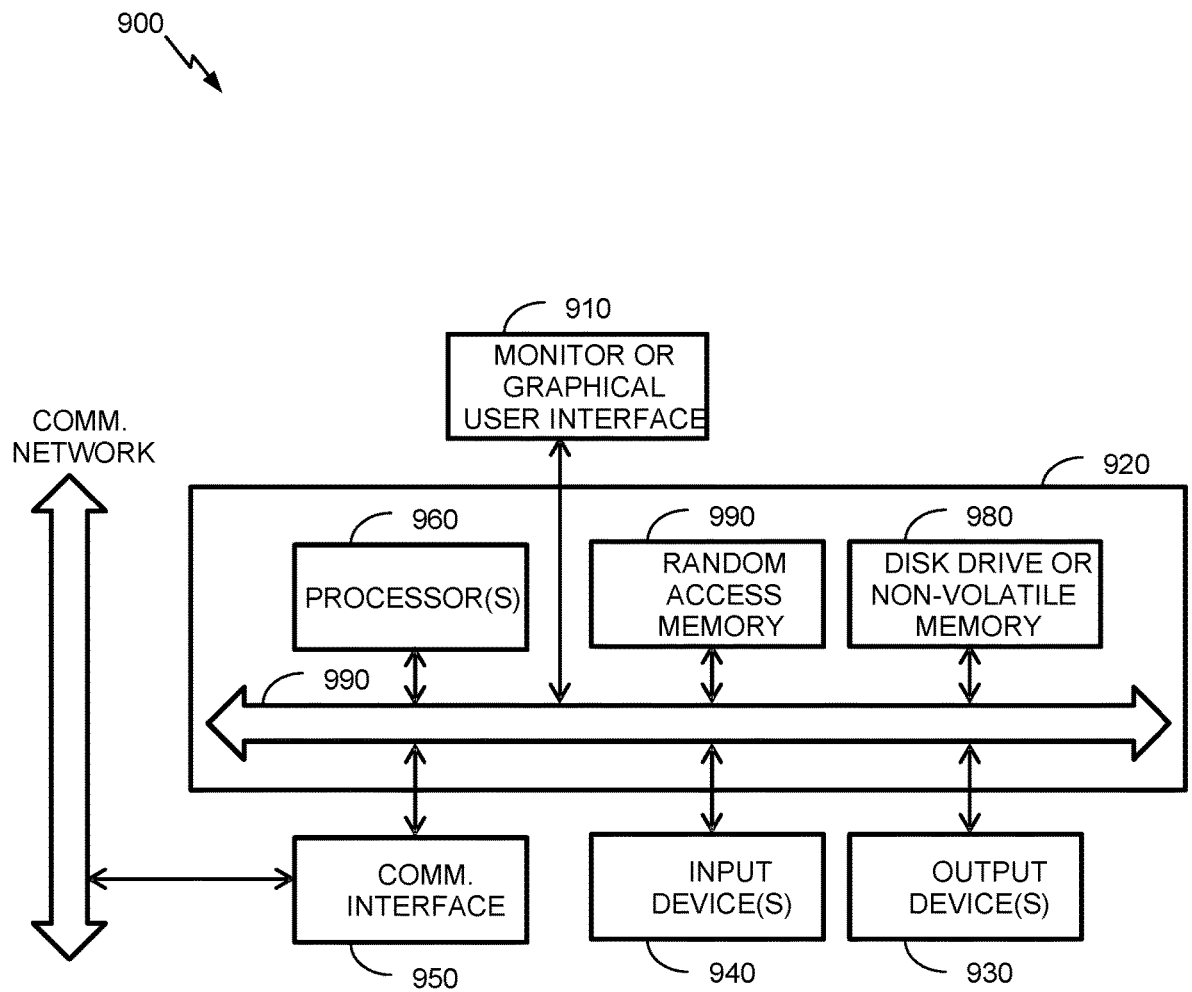
FIG. 9 is representative of a computer system capable of embodying the present disclosure.

FIG. 9 is representative of a computer system 900 capable of embodying the present disclosure, such as the error correction system 100 of FIG. 1, the host 210 and the storage device 220 of FIG. 2, and the computer system 400 of FIG. 4. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like. The error correction system 100 of FIG. 1 implements some or all of the components of the computer system 900.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 940 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 940 are typically embodied as a computer mouse, a trackball, a track pad, a joystick, a wireless remote, a drawing tablet, a voice command system, an eye tracking system, and the like. The user input devices 940 typically allow a user to select objects, icons, text and the like that appear on the monitor 910 via a command such as a click of a button or the like.

The user output devices 930 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read-only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A computer system for reading data from storage, the computer system comprising:
   a processor; and
   a memory communicatively coupled with the processor, the memory configured to store (i) client data as a codeword that comprises bits based on an error correction code (ECC) encoding procedure, (ii) a regression model, and (iii) computer-readable instructions, wherein:
   the regression model comprises a neural network,
   the neural network comprises an output node,
   the output node corresponds to a voltage read threshold for the memory, and
   the computer-readable instructions upon execution by the processor configure the computer system to:
      input, to the regression model, data related to one or more input conditions associated with the memory;
      receive the voltage read threshold based on the data; and
      read the client data based on the voltage read threshold, wherein reading the client data comprises decoding the codeword based on an ECC decoding procedure that uses values for the bits based on the voltage read threshold.

2. The computer system of claim 1, wherein the one or more input conditions comprise an operational condition and a storage condition.

3. The computer system of claim 2, wherein the operational condition comprises at least one of an endurance, a retention, an age, or a temperature associated with the memory.

4. The computer system of claim 2, wherein the memory is a NAND flash memory, and wherein the storage condition comprises at least one of a read distribution, a die index, a block index, or a wordline index associated with the NAND flash memory.

5. The computer system of claim 1, wherein the neural network comprises a plurality of output nodes, each corresponding to outputting one voltage read threshold.

6. The computer system of claim 1, wherein the memory comprises a memory block, wherein the memory block comprises a memory page, and wherein the neural network comprises a number of output nodes based on the memory page.

7. The computer system of claim 1, wherein the regression model comprises a second neural network, wherein the memory comprises a memory block, wherein the memory block comprises a first memory page and a second memory page, wherein the neural network is associated with the first memory page and comprises a first number of output nodes based on the first memory page, wherein the second neural network is associated with the second memory page and comprises a second number of output nodes based on the second memory page.

8. The computer system of claim 7, wherein the first number of output nodes is different from the second number of output nodes.

9. The computer system of claim 7, wherein the memory is a triple cell level (TLC) NAND flash memory, wherein the first memory page corresponds to a most significant bit (MSB) page, wherein the second memory page corresponds to a least significant bit (LSB) page, wherein the first number of output nodes is three, and wherein the second number of output nodes is two.

10. The computer system of claim 9, wherein the memory further comprises a central significant bit (CSB) page, wherein the regression model comprises a third neural network, wherein the third neural network is associated with the CSB page and comprises two outputs nodes based on the CSB page.

11. The computer system of claim 1, wherein the memory comprises a plurality of memory pages, wherein the regression model comprises a plurality of neural networks each associated with one of the plurality of memory pages and having a number of output nodes based on the associated memory page.

12. A computer-implemented method for reading client data from a memory, the computer-implemented method comprising:
   inputting, to a regression model, data related to one or more input conditions associated with the memory, wherein the regression model comprises a neural network, and wherein the neural network comprises an output node corresponding to a voltage read threshold for the memory;
   receiving the voltage read threshold based on the data; and
   reading, from the memory storing the client data as a codeword that comprises bits based on an error correction code (ECC) encoding procedure, the client data based on the voltage read threshold, wherein reading the client data comprises decoding the codeword based on an ECC decoding procedure that uses values for the bits based on the voltage read threshold.

13. The computer-implemented method of claim 12, wherein the neural network is trained to output the voltage read threshold from the output node based on the data related to the one or more input conditions.

14. The computer-implemented method of claim 12, further comprising training the neural network based on training data that is measured under combinations of operational conditions and storage conditions, wherein the training data comprises at least one of endurance data, retention data, age data, temperature data, read distribution data, die index data, block index data, or wordline index data.

15. The computer-implemented method of claim 14, wherein the training is supervised training that uses a loss function, wherein the loss function is computed based on voltage read thresholds each corresponding to one of the combinations of operational conditions and storage conditions.

16. The computer-implemented method of claim 12, wherein the one or more input conditions comprises a first set of discrete input conditions and a second set of continuous input conditions.

17. The computer-implemented method of claim 12, wherein the regression model comprises a second neural network, wherein the memory comprises a memory block, wherein the memory block comprises a first memory page and a second memory page, wherein the neural network is associated with the first memory page and comprises a first number of output nodes based on the first memory page, wherein the second neural network is associated with the second memory page and comprises a second number of output nodes based on the second memory page.

18. A non-transitory computer-readable storage medium storing instructions that, upon execution on a computer system that includes a memory storing client data, cause the computer system to perform operations comprising:

inputting, to a regression model, data related to one or more input conditions associated with the memory, wherein the regression model comprises a neural network, and wherein the neural network comprises an output node corresponding to a voltage read threshold for the memory;

receiving the voltage read threshold based on the data; and reading, from the memory storing the client data as a codeword that comprises bits based on an error correction code (ECC) encoding procedure, the client data based on the voltage read threshold, wherein reading the client data comprises decoding the codeword based on an ECC decoding procedure that uses values for the bits based on the voltage read threshold.

19. The non-transitory computer-readable storage medium of claim 18, wherein the memory comprises a plurality of memory pages, wherein the regression model comprises a plurality of neural networks each associated with one of the plurality of memory pages and having a number of output nodes based on the associated memory page.

20. The non-transitory computer-readable storage medium of claim 19, wherein the operations comprise training the neural network based on training data and a loss function, wherein the training data that is measured under combinations of operational conditions and storage conditions, and wherein the loss function is computed based on voltage read thresholds each corresponding to one of the combinations of operational conditions and storage conditions.

\* \* \* \* \*